(12) United States Patent
Liu et al.

(10) Patent No.: US 6,785,118 B1
(45) Date of Patent: Aug. 31, 2004

(54) MULTIPLE ELECTRODE CAPACITOR

(75) Inventors: Tao Liu, University Place, WA (US); Steve Schiveley, Forest Grove, OR (US); Peir Chu, Portland, OR (US); Mike Greenwood, Oregon City, OR (US); Aaron J. Steyskal, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/403,805

(22) Filed: Mar. 31, 2003

(51) Int. Cl.⁷ .................. H01G 4/005; H01G 4/228; H01G 4/06
(52) U.S. Cl. .................. 361/303; 361/306.1; 361/311
(58) Field of Search .................. 361/303–305, 361/309, 311–313, 301.2, 301.3, 301.4, 306.1, 306.2, 306.3, 307, 308.1, 308.2, 308.3; 257/306–309

(56) References Cited

U.S. PATENT DOCUMENTS

| | | | |
|---|---|---|---|
| 5,639,507 A | 6/1997 | Galvagni | 427/79 |
| 5,880,925 A | 3/1999 | DuPre et al. | |
| 5,973,910 A | 10/1999 | Gardner | 361/313 |
| 5,978,206 A * | 11/1999 | Nishimura et al. | 361/303 |
| 6,064,108 A | 5/2000 | Matinez | 257/532 |
| 6,222,246 B1 * | 4/2001 | Mak et al. | 257/532 |
| 6,243,253 B1 | 6/2001 | DuPre et al. | 361/306 |
| 6,324,048 B1 | 11/2001 | Liu | 361/306.1 |
| 6,430,025 B2 | 8/2002 | Naito et al. | 361/303 |
| 6,442,813 B1 | 9/2002 | Sakamoto et al. | 29/25.42 |
| 6,459,561 B1 | 10/2002 | Galvagni et al. | 361/306.3 |
| 6,462,932 B1 | 10/2002 | Naito et al. | 361/306.1 |
| 6,483,692 B2 | 11/2002 | Figueroa et al. | 361/308.1 |
| 6,542,351 B1 * | 4/2003 | Kwang | 361/303 |
| 6,635,916 B2 * | 10/2003 | Aton | 257/306 |
| 2002/0047154 A1 * | 4/2002 | Sowlati et al. | 257/307 |
| 2002/0071258 A1 | 6/2002 | Mosley | 361/782 |
| 2002/0085334 A1 | 7/2002 | Figueroa | |
| 2002/0134581 A1 | 9/2002 | Figueroa et al. | 174/260 |

FOREIGN PATENT DOCUMENTS

WO   WO 01/80256 A1 * 10/2001   ............ H01G/4/30

* cited by examiner

*Primary Examiner*—Anthony Dinkins
*Assistant Examiner*—Eric Thomas
(74) *Attorney, Agent, or Firm*—Schwegman, Lundberg, Woessner & Kluth, P.A.

(57) ABSTRACT

A capacitor having a plurality of layers with at least one layer including a plurality of electrodes is described. In an embodiment, the electrodes are elongate. The plurality of electrodes includes a plurality of first polarity electrodes and a plurality of second polarity electrodes. In an embodiment, pairs of electrodes are formed by twisting one first polarity electrode and one second polarity electrode together. In an embodiment, first polarity electrodes and second polarity electrodes are woven together in each layer.

33 Claims, 7 Drawing Sheets

US 6,785,118 B1

MULTIPLE ELECTRODE CAPACITOR

FIELD

This application relates generally to capacitors, and more specifically to capacitors having a plurality of electrodes.

BACKGROUND

Capacitors are used in integrated circuits to store and supply electrical charge. Capacitors include conductive electrodes (sometimes referred to as plates) that are separated by dielectrics and store electrostatic charges. The charge Q is directly related to the product of capacitance C and voltage V, i.e., Q=CV. Capacitance is directly proportional to the area of either electrode A and to the dielectric constant ($\in$) of the media separating the electrodes, and inversely proportional to the distance between the electrodes d: C=$\in$A/4$\pi$d. Accordingly, capacitance can be desirably increased by increasing the area of the electrodes, increasing the dielectric constant, or deceasing the distance between the electrodes.

Capacitors are typically found at an interface between an integrated circuit and other integrated circuits and other systems. A specific application of capacitors is in a voltage stabilizer that maintains an applied voltage in the event of a voltage fluctuation at the interface. Today's integrated circuits operate at ever faster speeds. Accordingly, a capacitor must efficiently and quickly supply its stored charge to maintain the voltage level during such a fluctuation. However, capacitors in addition to storing charge have a small effective inductance and resistance. Such an inductance is called equivalent series inductance ("ESL") or parasitic inductance. A capacitor must have a low ESL to quickly supply its charge, especially at high frequencies (fast operating speeds). Moreover, in some electrical devices, such as devices with high performance processors, capacitors may have different ESL or equivalent series resistance ("ESR") depending on the capacitor's length-height or length-width orientation. Improper capacitor orientation may result in failure of the device. Accordingly, it is desirable to provide a capacitor having a low ESL and a capacitor having characteristics that are not dependent on the capacitor's orientation.

DESCRIPTION

Figure 1A:
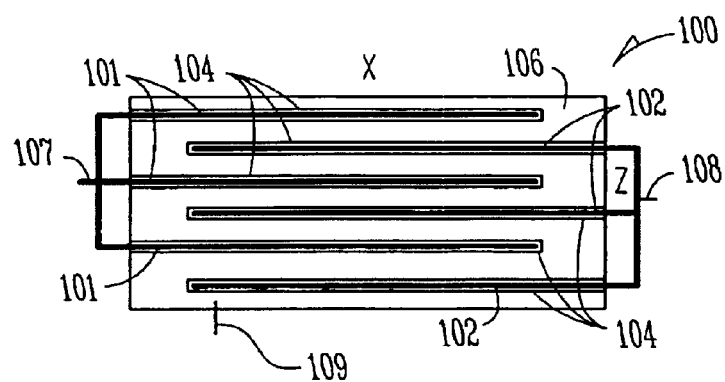
FIG. 1A shows a schematic first side view of a capacitor of an embodiment of the present invention.

In the following description, reference is made to the accompanying drawings that show, by way of illustration, specific embodiments in which the invention may be practiced. These embodiments are described in sufficient detail to enable those skilled in the art to practice the embodiments of the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views. Moreover, similar elements in different figures are designated with the same two least significant digits throughout the figures.

Figure 1B:
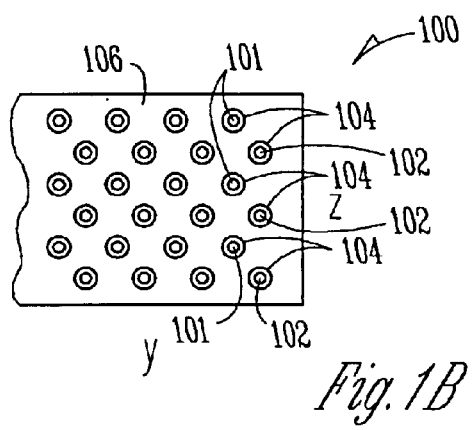
FIG. 1B shows a schematic second side view of a capacitor of an embodiment of the present invention.

FIG. 1A shows a schematic first side view of a multilayer capacitor 100. FIG. 1B shows a partial, end view of capacitor 100. Capacitor 100 includes a plurality of elongate, first electrodes 101 and a plurality of elongate, second electrodes 102. Electrodes 101 and 102 are electrically conductive and together are adapted to store electrical charge. In an embodiment, at least one of electrodes 101 and 102 is formed of a metal. In an embodiment, the metal is aluminum. The first and second electrodes 101, 102 extend lengthwise in a first direction, the X-direction as shown in FIGS. 1A and 1B. Electrodes 101, 102 are significantly longer in the first direction than in their cross-sectional directions. In an embodiment, electrodes 101, 102 are approximately ten times or greater in length than in cross-section, i.e., diameter or width. Stated another way, the electrodes 101, 102 are not plates. That is, a single electrode 101 or 102 does not extend over a significant area of a planar layer in capacitor 100. Moreover, there is a plurality of electrodes 101 or 102 in each layer of the capacitor 100. As shown in FIG. 1A, the Y-plane includes a plurality of first electrodes 101 and a plurality of second electrodes 102. As shown in FIG. 1B, capacitor 100 includes a plurality of both first electrodes 101 and second electrodes 102 in the Z-plane.

A dielectric layer 104 surrounds each of at least one of the plurality of first electrodes 101 and plurality of second electrodes 102. In the FIG. 1A embodiment, both the first electrodes 101 and the second electrodes 102 are surrounded by dielectric layer 104. This embodiment is referred to herein as a bipolar wire electrode capacitor. Dielectric layer 104 is formed on the electrode 101 or 102 by an anodization process, dip coating, or other thin film fabrication technique such as physical vapor deposition, chemical vapor deposition, etc.

First electrodes 101 and second electrodes 102 are housed in a body 106. In an embodiment, body 106 includes a non-conductive polymer that operates as a further dielectric separating the first electrodes 101 from the second electrodes 102. In an embodiment, the body 106 is formed of a high-k, e.g., greater than 5.0, material.

The first electrodes 101 are connected to a first node or capacitor terminal 107. The second electrodes 102 are connected to a second node or capacitor terminal 108. The terminals 107, 108 are adapted to connect the electrodes 101, 102 to an external circuit, for example, at an interface. In an embodiment, terminal 107 connects to a first potential in the external circuit. Terminal 108 connects to a second potential in the external circuit with the second potential being different than the first potential to charge the capacitor 100. In an embodiment, the first electrodes 101 are connected to a more positive potential than the second electrodes 102, which in an embodiment are connected to ground.

In a further embodiment, electrodes 101 and 102 are connected to terminals 107, 108, which are connected to a same potential in an external circuit. The body 106 is formed of a conductive material. Examples of conductive material include conductive polymers. Body 106 is connected to a terminal 109 that is connected to the external circuit. Electrodes 101 and 102 form one electrode, sometimes referred to as a plate, of capacitor 100. Body 106 forms the other electrode of capacitor 100. Dielectric layers 104 separate the electrodes 101 and 102 from the body 106 to form capacitor 100.

Figure 1C:
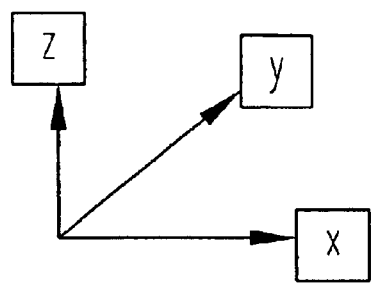
FIG. 1C shows an orientation axis for FIGS. 1A and 1B.

In an embodiment, the electrodes 101, 102 are symmetrical about a center axis of the capacitor 100. The center axis extends in the length direction of the electrodes 101,102. Relative to FIGS. 1A–1C, the center axis extends in the X-direction. The symmetrical layout results in a capacitor that has the same equivalent series resistance and equivalent series inductance whether the capacitor is mounted in a length-width orientation or a length-height orientation.

Figure 2A:
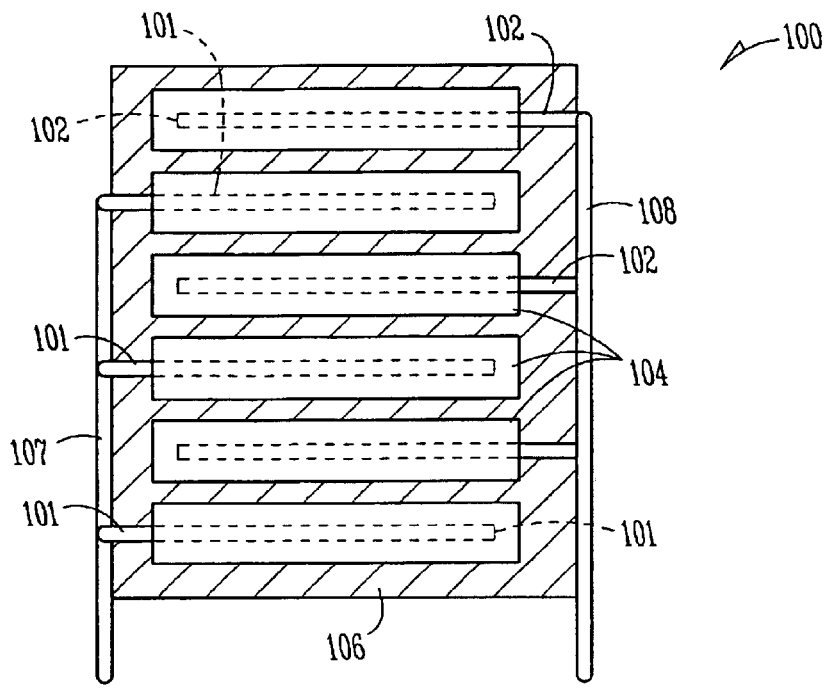
FIG. 2A shows a perspective view of a portion of a capacitor of an embodiment of the present invention.
Figure 2B:
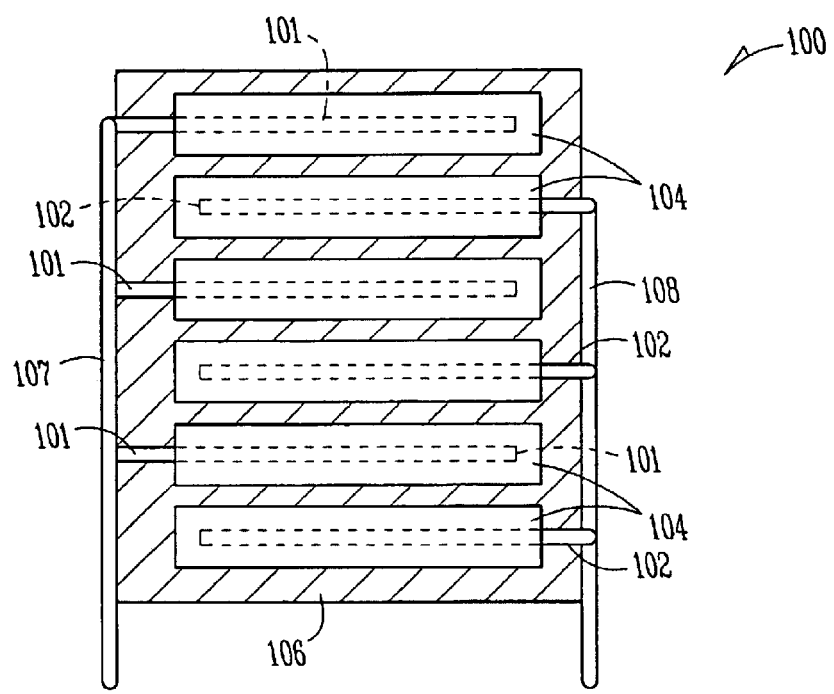
FIG. 2B shows a perspective view of a portion of a capacitor of an embodiment of the present invention.

FIGS. 2A and 2B show adjacent cross-sectional views of the bi-polar wire electrode capacitor 100 according to an embodiment of the present invention. The FIG. 2A view shows a repeating pattern of one second electrode 102 directly above one first electrode 101. The FIG. 2B view shows a repeating pattern of one first electrode 101 directly above one second electrode 102. These structures shown in FIGS. 2A and 2B alternate so that the capacitor 100 has a first vertical (relative to FIGS. 2A and 2B) layer as shown in FIG. 2A followed by a second vertical layer as shown in FIG. 2B, with this pattern repeating itself until a desired capacitance is reached. Thus, a first electrode 101 is directly below and directly behind topmost, front second electrode 102. A first electrode 101 positioned interiorly, i.e., not at the top or at the bottom of the depicted layers, has second electrodes 102 positioned above, below, in front and in back thereof. Thus, one second electrode 102 is positioned at each orthogonal side of each first electrode 101 within the interior of the capacitor 100. First electrodes 101 at the edges of capacitor 100 have second electrodes at three orthogonal sides. With such a structure, surface area of the capacitor 100 is increased due to a plurality of sides of each first electrode 101 facing a respective side of the adjacent second electrodes 102. Specifically, an interior first electrode 101 has all four sides acting as capacitive surface area with adjacent s ingle sides of four different second electrodes 102 to form a capacitive sub-structure of capacitor 100.

Figure 3:
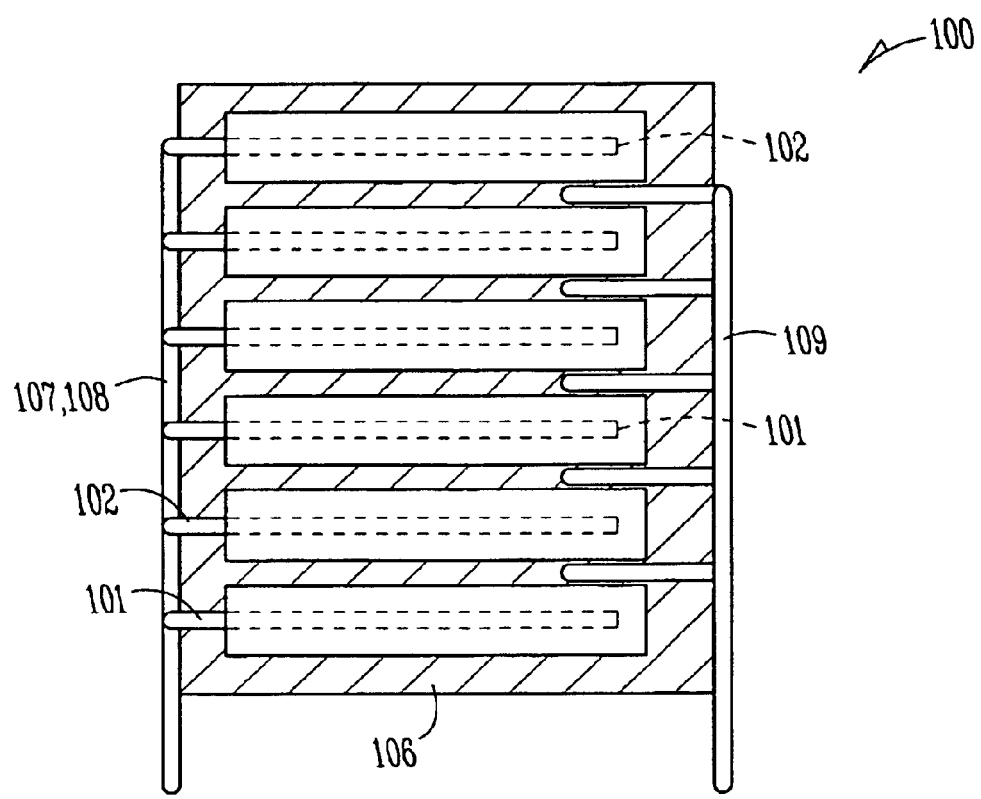
FIG. 3 shows a perspective view of a portion of a capacitor of an embodiment of the present invention.

FIG 3 shows a cross sectional view of a polar wire electrode capacitor 100, i.e., capacitor 100 with a conductive body 106 acting as one of the capacitor plates. The terminal 109 is connected to body 106 at one side of capacitor 100. Common electrode terminal 107, 108 is connected to electrodes 101, 102 and extends from the other side of the capacitor 100. In an embodiment, body terminal 109 and common electrode terminal 107, 108 switch sides in successive layers within capacitor 100 to reduce ESL.

Figure 4:
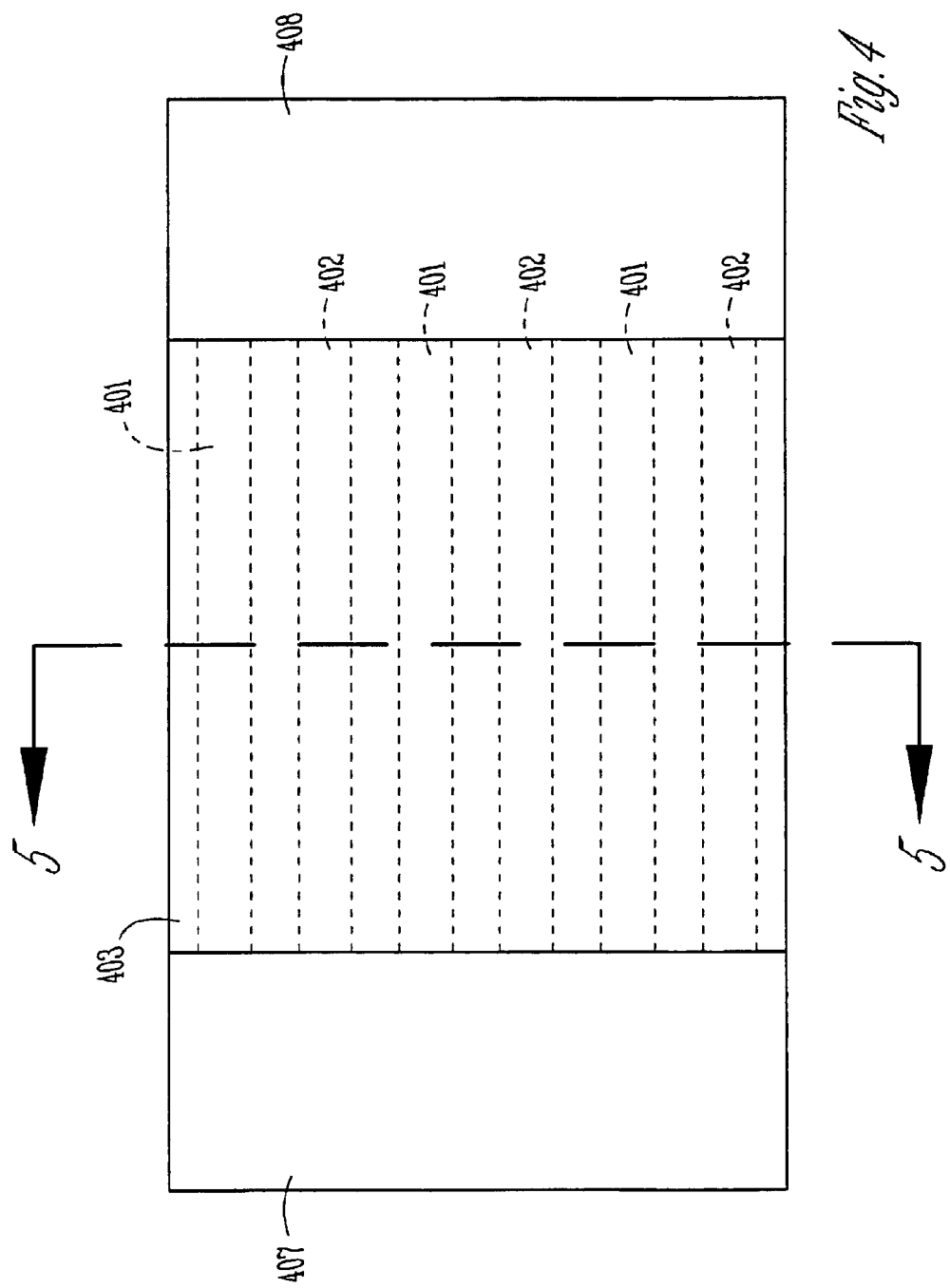
FIG. 4 shows a top view of a capacitor of an embodiment of the present invention.
Figure 5:
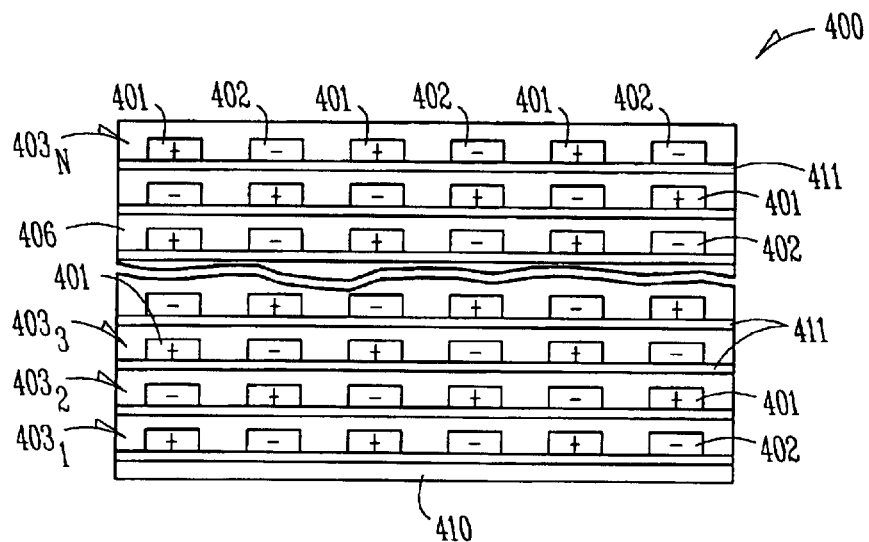
FIG. 5 shows a cross-section view taken generally along line 5—5 of FIG. 4.

FIGS. 4 and 5 show a multilayer 400 according to an embodiment of the present invention. Capacitor 400 includes a first terminal 407 and a second terminal 408 with a central capacitive region 403 fabricated on a substrate 410. Substrate 410 is an integrated circuit substrate formed from silicon, or other semiconductor material. Region 403 includes layers $403_1$, $403_2$, $403_3$, ... $403_N$. Each layer $403_1$, $403_2$, $403_3$, ... $403_N$ includes a base 411 on which are formed a plurality of charge storing, conductive first electrodes 401 and a plurality of conductive second electrodes 402. Base 411 in an embodiment, is a dielectric. An example of a material for base 411 includes barium titanate ($BaTiO_3$). The layers $403_1$, $403_2$, $403_3$, ... $403_N$ further include a body 406 that acts as a further dielectric between the electrodes 401 and 401.

Referring still to the FIGS. 4 and 5 embodiment, the first plurality of electrodes 401 are the positive electrodes of the capacitor 400, which are adapted to store charge in the capacitor. First electrodes 401 are connected to the first terminal 407 for connection to an external circuit. The second plurality of electrodes 402 are the negative electrodes. Second electrodes 402 are connected to second terminal 408 for connection to an external circuit. Each layer $403_1$, $403_2$, $403_3$, ... $403_N$ alternates between a first electrode 401 and a second electrode 402. Accordingly, no two first electrodes 401 are directly adjacent on any layer. No two second electrodes 402 are directly adjacent on any layer. The same alternating pattern applies to vertically adjacent layers, e.g., layer $403_2$ and both layer $403_1$, and $403_3$. Layer $403_1$, starts with a first electrode 401. The immediately vertically adjacent layer $403_2$ start with the opposite polarity electrode 402. This pattern repeats itself so that each successive adjacent (vertically spaced) layer, e.g., layers $403_1$, and $403_2$; $403_2$ and $403_3$, etc., starts with the other of the electrodes 401, or 402. Accordingly, all non-edge electrodes 401 or 402 have an electrode of the opposite polarity orthogonally spaced at all four sides thereof by a dielectric to form a capacitive structure in capacitor 400. Specifically in the embodiment shown in FIG. 5, a second electrode 402 is positioned above, below, to the left and to the right of an interior, non-edge first electrode 401. A central, non-edge second electrode 402 has a first electrode 401 positioned above, below, to the left and to the right. The first electrodes 401 positioned on the side edges of the capacitor 400 have second electrodes 402 positioned above, below, and to one interior side. The second electrodes 402 positioned on the side edges of the capacitor 400 have first electrodes 401 positioned above, below, and to one interior side. The first electrodes 401 positioned on the top edge of the capacitor 400 have second electrodes 402 positioned below and to both sides. The second electrodes 402 positioned on the top edge of the capacitor 400 have first electrodes 401 positioned below and to both sides. In an embodiment, the first and second electrodes 401 and 402 are symmetrical about a central longitudinal axis of capacitor 400.

Figure 6A:
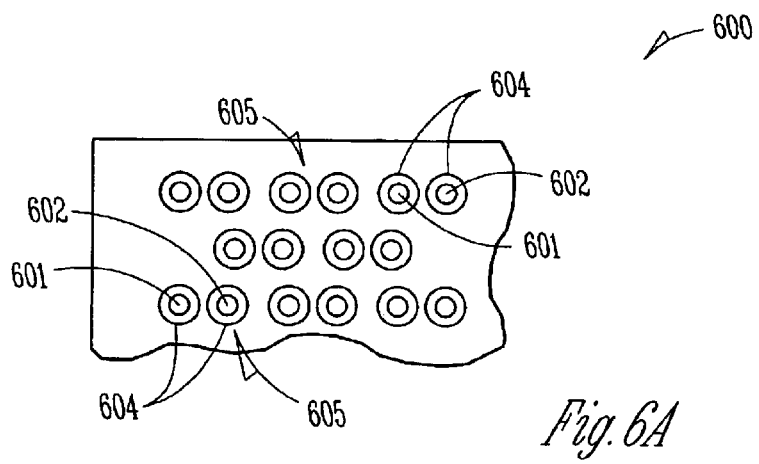
FIG. 6A shows a further embodiment of a portion of a capacitor.
Figure 6B:
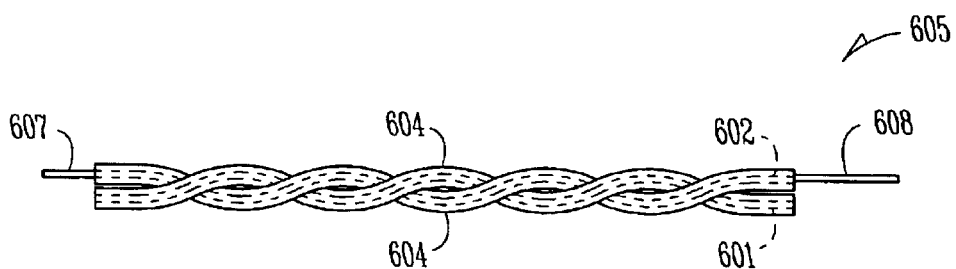
FIG. 6B shows a further embodiment of a portion of the FIG. 6A capacitor.

FIGS. 6A and 6B show a further integrated circuit, multilayer capacitor 600 according to an embodiment of the present invention. FIG. 6A shows a partial cross-sectional view of capacitor 600. FIG. 6B shows an electrode pair 605 of capacitor 600. Each layer in capacitor 600 includes a plurality of electrode pairs 605. Each pair 605 includes an elongate, first polarity electrode 601 and an elongate, second polarity electrode 602, which are twisted together. Electrodes 601 and 602 are substantially similar to the electrodes 101 and 102 as described herein and are adapted to connect to terminals 607 and 608, which are substantially similar to terminals 107 and 108 as described herein. However, unlike electrodes 101 and 102 the first electrode 601 and the second electrode 602 wind about each other to form the pair 605. However, the first electrode 601 and second electrode 602 are not in direct electrical contact, i.e., shorted, to form a capacitive structure. The electrodes 601 and 602, in an embodiment, are each covered by a dielectric layer 604 and embedded in a body 606 to form a bipolar capacitive structure. In an embodiment, body 606 is non-conductive. In an embodiment, one of electrodes 601 and 602 are connected to a same terminal and embedded in a conductive body 606 to form a polar capacitive structure.

Figure 7A:
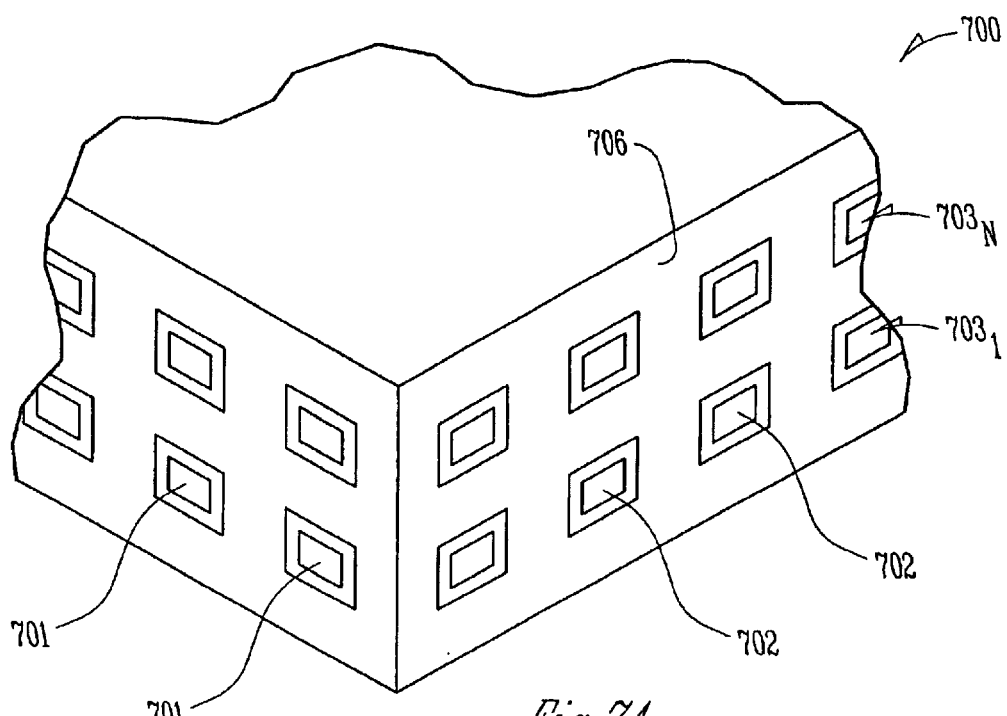
FIG. 7A shows a further embodiment of a portion of a capacitor.
Figure 7B:
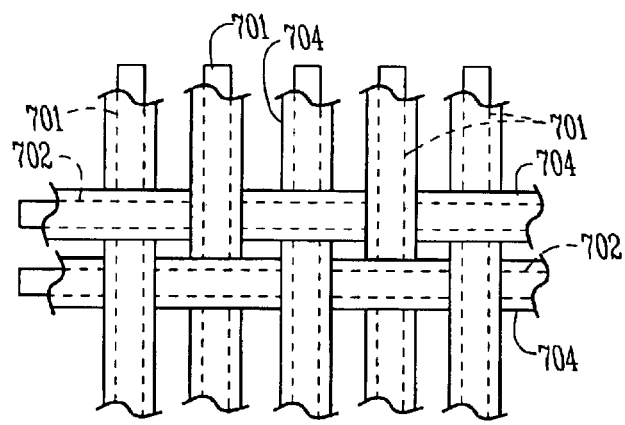
FIG. 7B shows a top view of a layer of the FIG. 7A embodiment.

FIGS. 7A and 7B show a further integrated circuit, multilayer capacitor 700 according to an embodiment of the present invention. FIG. 7A shows a partial, cut-away view of capacitor 700 having at least two layers $703_1$–$703_N$. FIG. 7B shows a top view of a layer $703_N$ of capacitor 700. At least one layer $703_N$ includes a plurality of elongate, first electrodes 701 and a plurality of elongate, second electrodes 702. Electrodes 701 and 702 are electrically conductive and adapted to store electrical charge. In an embodiment, at least one of electrodes 701 and 702 is formed of a metal. In an embodiment, the metal is aluminum. Electrodes 701, 702 are significantly longer in their lengthwise direction than in their cross-sectional directions. In an embodiment, electrodes 701, 702 are approximately ten times or greater in length than in width. Stated another way the electrodes 701, 702 are not plates, i.e., a single electrode 701 or 702 does not extend over a significant area of a layer in the capacitor 700. Moreover, there are a plurality of electrodes 701 and 702 in a layer of capacitor 700. In an embodiment, each of at least one of the plurality of first electrodes 701 and plurality of second electrodes 702 are surrounded by a dielectric layer 704. In an embodiment, both the first electrodes 701 and the second electrodes 702 are surrounded by a respective dielectric layer 704 (a bi-polar wire electrode capacitor). First electrodes 701 and second electrodes 702 are housed in a body 706. In an embodiment, body 706 includes a non-conductive polymer that operates as a further dielectric separating first electrodes 701 from second electrodes 702. In an embodiment, the body 706 is formed of a high-k, e.g., greater than 5.0, adhesive material. The first electrodes 701 and the second electrodes 702 are adapted to be connected to a first terminal and a second terminal, respectively, as described herein. In an embodiment, body 706 is formed from a conductive material to form one of the electrodes or plate of a polar wire capacitor embodiment with the first and second electrodes 701 and 702 forming the other electrode or plate of the capacitor. In this embodiment, the first and second electrodes 701 and 702 are connected to a terminal or node of a circuit and the body 706 is connected to another terminal or node of the circuit.

First electrodes 701 extend lengthwise in a first direction. Second electrodes 702 extend lengthwise in a second direction. In an embodiment, the first direction is transverse to the second direction. In an embodiment, the second direction is orthogonal to the first direction. First electrodes 701 and second electrodes 702 are interwoven within a respective layer, e.g., see FIG. 7B. A first of an adjacent pair of second electrodes 702 goes over one of the first electrodes 701. The second of the adjacent pair of second electrodes 702 goes beneath the one first electrode 701. Accordingly, the second electrodes 702 alternate going over and under a same first electrode 701 in the first direction. The layer $703_N$ thus has a woven structure. A plurality of such layers are stacked one above the other to form capacitor 700.

Figure 8:
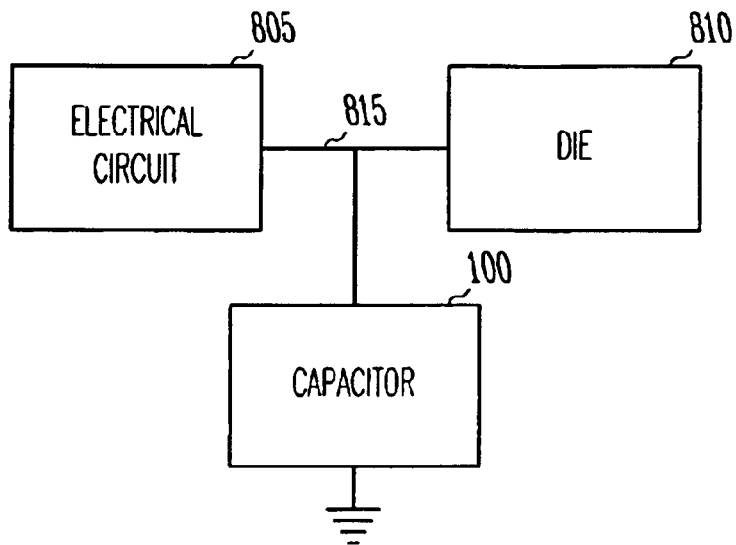
FIG. 8 shows a schematic view of a system including an electrical component and a capacitor.

FIG. 8 shows a system 800 including an electrical circuit 805 and a die 810 operably connected together through an interface 815. In an embodiment, interface 815 includes at least one conductive binds, traces, conductors, and electrically conductive lines. In an embodiment, interface 815 is a power supply line. In an embodiment, interface 815 is a data input/output line. In an embodiment, interface 815 is a control signal or address line. Capacitor (e.g., 100, 400, 600, or 700) is connected to conductive interface 815. In an embodiment, a first group of capacitor first electrodes (e.g., 101, 401, 601, or 701) are connected to interface 815. A second group of capacitor second electrodes (e.g., 102, 402, 602, or 702) are connected to a node in the electric circuit 805. In an embodiment, the node is a grounded node. As described in the embodiments above capacitor (e.g., 100, 400, 600, or 700) comprises a plurality of elongate, conductive electrodes separated by a dielectric and in some embodiments a conductive material and the dielectric.

Figure 9:
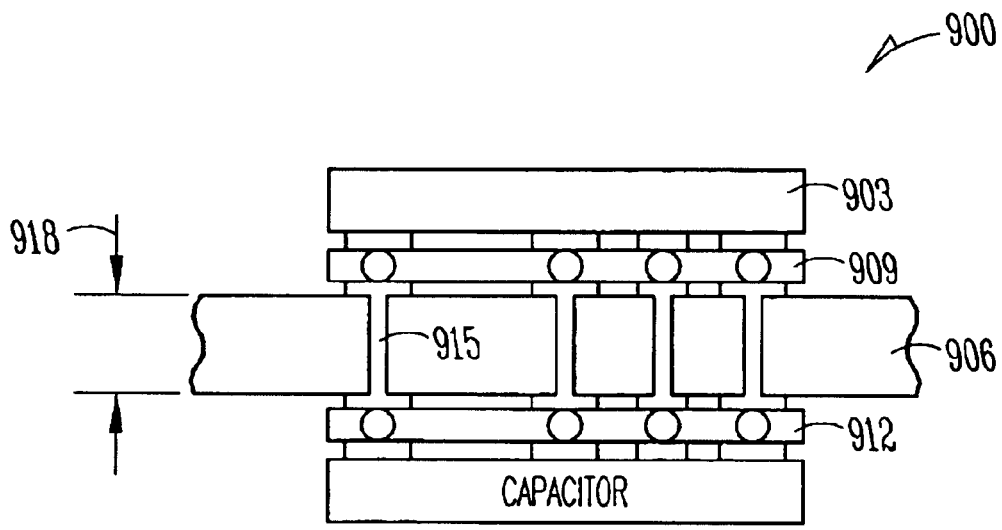
FIG. 9 shows a cross-sectional view of a system including an electrical component and a capacitor.

FIG. 9 shows a cross-sectional view of one embodiment of system 900 for coupling die 903 to capacitor (e.g., 100, 400, 600, or 700) through common substrate 906. In an embodiment, die 903 includes an electronic device, such as a processor, a memory, a communication system, or an application specific integrated circuit. Die 903 is coupled to a first surface of substrate 906 by controlled collapse chip connection (C4) 909. It will be recognized by one of skill in the art that other conventional structures may mechanically and electrically connect die 903 to substrate 906. Capacitor (e.g., 100, 400, 600, or 700) is coupled to a second surface of substrate 906 by a mechanical or electrical connection 912. Examples of connection 912 include surface mount or controlled collapse chip connection. Conductive interconnects 915 extend from the first surface to the second surface of substrate 906 to couple the capacitor to die 903. In an embodiment, interconnects 915 are formed by filling a via in the substrate 906 with a conductive material, such as metal. In one embodiment, substrate 906 is fabricated from a ceramic material. Alternatively, substrate 906 is fabricated from an organic material. Preferably, substrate 906 is thin, which permits a short coupling distance between the capacitor and die 903. In one embodiment, substrate 906 has a thickness 918 of less than about 1 millimeter, which reduces the length of interconnects 915. A short coupling distance reduces the inductance and resistance in the circuit in which the capacitor is connected. It will also be recognized that the capacitor could be coupled directly to die 903 in an embodiment.

As described herein, electrodes for the capacitor are thin, elongate electrical conductors. Elongate as used herein refers to a structure that has a first dimension that is significantly greater than a second dimension. In an embodiment, the first dimension is also significantly greater than the third dimension. For example, the length is significantly greater than the width and height or diameter. In an embodiment, significantly greater is defined as being at least about 10 times greater. In an embodiment, significantly greater refers to at least about 25 times greater. In an embodiment, significantly greater refers to at least about 100 times greater. It will be understood that the cross-section of a electrode may be of any shape, for example but not limited to rectangular, polygons, circular. Semiconductor fabrication techniques lends itself to non-curved surfaces of the electrodes.

Some embodiments described herein specifically relate to multilayer capacitors formed according to integrated circuit fabrication techniques, which limits the minimum cross section dimension of the electrode. For example, current integrated circuit techniques that are suitable for production quality components may be limited by photolithography or other fabrication techniques. Some techniques limit the minimum cross sectional dimension of the electrodes to about 10 nanometers (nm). Accordingly, the electrodes have a length of at least 0.1 micrometer ($\mu$m). In an embodiment, the electrodes have a length of at least 1.0 micrometer ($\mu$m). In an embodiment, the electrodes have a length of at least 100 micrometer ($\mu$).

The embodiments described herein thus include a plurality of first electrodes (101, 401, 601, 701) and a plurality of second electrodes (102, 402, 602, 702) in at least one layer of a capacitor. In an embodiment, a plurality of layers of the capacitor have a plurality of first electrodes (101, 401, 601, 701) and a plurality of second electrodes (102, 402, 602, 702). The first and second electrodes are positioned such that they respectively reduce equivalent series inductance and increase capacitance. Moreover, an embodiment of the capacitor is symmetrical about its length axis. Thus, the capacitor can be mounted in an electrical system in either its length-width plane or its length height plane with unchanged electrical performance.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A capacitor, comprising:
    a plurality of layers, wherein at least one of the plurality of layers includes:
        a plurality of elongate, first electrodes;
        a plurality of elongate second electrodes adjacent the first electrodes;
        a dielectric intermediate the first electrodes and the second electrodes; and wherein the first electrodes and the second electrodes are interwoven in the at least one layer.

2. The capacitor of claim 1, wherein the dielectric includes a layer covering at least one of the first electrodes and the second electrodes.

3. The capacitor of claim 1, wherein the dielectric includes a first layer covering the first electrodes and a second layer covering the second electrodes.

4. The capacitor of claim 1, wherein the plurality of first electrodes are adapted to connect to a first potential; and wherein the plurality of second electrodes are adapted to connect to a second potential that is different than the first potential.

5. The capacitor of claim 1, wherein the first electrodes include at least one elongate metal first electrode.

6. The capacitor of claim 5, wherein the second electrodes include at least one elongate metal second electrode.

7. The capacitor of claim 6, wherein the at least one first electrodes and at least one second electrodes include aluminum.

8. The capacitor of claim 1, wherein the layers define a first side and a second side, wherein the first electrodes of the at least one layer are adapted to only connect a first terminal at the first side, and wherein the second electrodes of the at least one layer are adapted to only connect a second terminal at the second side.

9. A capacitor comprising:
    a plurality of layers, wherein at least one of the plurality of layers includes:
        a plurality of elongate, first electrodes;
        a plurality of elongate second electrodes adjacent the first electrodes;
        a dielectric intermediate the first electrodes and the second electrodes; and
    wherein the first electrodes includes one electrode that is twisted with a further electrode of the second electrodes to form a twisted pair.

10. The capacitor of claim 9, wherein the dielectric includes a first layer wrapped around the plurality of elongate, first electrodes.

11. The capacitor of claim 10, wherein the dielectric includes a first layer wrapped around the plurality of elongate, second electrodes.

12. A capacitor, comprising:
    a plurality of layers, wherein at least one of the plurality of layers includes:
        a plurality of elongate, first electrodes;
        a plurality of elongate second electrodes adjacent the first electrodes;
        a dielectric intermediate the first electrodes and the second electrodes; and
    wherein the first electrodes and the second electrodes are adapted to connect to a same first node and act as a first capacitive plate, and wherein the at least one layer includes a conductive body electrically separated from the first and second electrodes, the conductive body is adapted to connect to a second node and act as a second capacitive plate.

13. The capacitor of claim 12, wherein the conductive body includes a conductive polymer.

14. A capacitor comprising:
    a body having a plurality of layers, each of the plurality of layers includes:
        a plurality of elongate, first electrodes;
        a plurality of elongate, second electrodes adjacent the first electrodes; and
        a dielectric intermediate the first electrodes and the second electrodes,
    wherein the dielectric includes a first layer surrounding each of the plurality of first electrodes and a second layer surrounding each of the plurality of second electrodes.

15. The capacitor of claim 14, wherein the plurality of layers defines a central axis, and the plurality of first electrodes and the plurality of second electrodes are symmetrical about the central axis.

16. The capacitor of claim 14, wherein the plurality of layers defines a first side, and the first side includes alternating ones of the plurality of the first electrodes and the plurality of the second electrodes.

17. The capacitor of claim 14, wherein the plurality of layers includes a first layer, a second layer, and a third layer, the second layer being intermediate the first layer and the third layer, the second layer including a first electrode with one second electrode on one side and one second electrode on the other side, the first layer including one of the plurality of second electrodes directly beneath one of the plurality of the first electrodes of the second layer, and the third layer includes one of the plurality of second electrodes directly above one of the plurality of the first electrodes of the second layer.

18. The capacitor of claim 14, wherein the plurality of first electrodes includes an interior first electrode having a second electrode of the plurality of second electrodes as a closest electrode.

19. The capacitor of claim 14, wherein the plurality of first electrodes includes an interior first electrode having one second electrode of the plurality of second electrodes at each of side of the interior first electrode.

20. The capacitor of claim 19, wherein the second electrodes at each side of the interior first electrode are orthogonally spaced from the interior first electrode.

21. The capacitor of claim 14, wherein the first electrodes alternate with the second electrodes across each of the layer.

22. The capacitor of claim 14, wherein the body is non-conductive.

23. The capacitor of claim 14, wherein the body is conductive and forms a first capacitive plate, and wherein the plurality of first electrodes and the plurality of second electrodes form a second capacitive plate.

24. A system, comprising:
   a substrate;
   a die operably connected to the substrate; and
   a multilayer, integrated circuit capacitor operably connected to the die, wherein the capacitor includes:
      a plurality of elongate, first electrodes;
      a plurality of elongate, second electrodes adjacent the first electrodes; and
      a dielectric intermediate the first electrodes and the second electrodes, wherein the dielectric includes a first dielectric layer surrounding the first electrodes and a second dielectric layer surrounding the second electrodes.

25. The system of claim 24, wherein first dielectric layer is separate from the second dielectric layer.

26. The system of claim 24, wherein the die includes a processor.

27. The system of claim 24, wherein the capacitor includes a conductive body intermediate the first electrodes and the second electrodes, the conductive body being adapted to form one capacitive node and both the first electrodes and the second electrodes form another capacitive node.

28. A system comprising:
   a substrate;
   a die operably connected to the substrate; and
   a multilayer, integrated circuit capacitor operably connected to the die, wherein the capacitor includes:
      a plurality of elongate, first electrodes;
      a plurality of elongate, second electrodes adjacent the first electrodes;
      a dielectric intermediate the first electrodes and the second electrodes;
   wherein the capacitor includes at least one layer of the plurality of layers having a pair of electrodes formed from one of the first electrodes twisted with one of the second electrodes.

29. The system of claim 28, wherein the dielectric includes a first dielectric layer surrounding the first electrodes and a second dielectric layer surrounding the second electrodes.

30. A system of claim 19, comprising:
   a substrate;
   a die operably connected to the substrate; and
   a multilayer, integrated circuit capacitor operably connected to the die, wherein the capacitor includes:
      a plurality of elongate, first electrodes;
      a plurality of elongate, second electrodes adjacent the first electrodes, wherein the second electrodes are woven into the first electrodes and
      a dielectric intermediate the first electrodes and the second electrodes.

31. The system of claim 30, wherein the first direction and the second electrodes extend in a second direction different than the first direction.

32. The system of claim 31, wherein the die includes at least one of a processor, logic circuits, a memory, and an application specific integrated circuit.

33. A capacitor, comprising:
   a plurality of elongate, wherein at least one of the plurality of layers includes:
      a plurality of elongate, first electrodes;
      a plurality of elongate second electrodes adjacent the first electrodes;
      a dielectric intermediate the first electrodes and the second electrodes; and
   wherein the dielectric includes a first layer covering the first electrodes and a second layer covering the second electrodes.

* * * * *

UNITED STATES PATENT AND TRADEMARK OFFICE
CERTIFICATE OF CORRECTION

| | | |
|---|---|---|
| PATENT NO. | : 6,785,118 B1 | Page 1 of 1 |
| APPLICATION NO. | : 10/403805 | |
| DATED | : August 31, 2004 | |
| INVENTOR(S) | : Liu et al. | |

It is certified that error appears in the above-identified patent and that said Letters Patent is hereby corrected as shown below:

In column 7, line 60, in Claim 7, after "and" insert -- the --.

In column 8, line 1, in Claim 9, after "capacitor" insert -- , --.

In column 8, line 16, in Claim 11, delete "first" and insert -- second --, therefor.

In column 9, line 9, in Claim 21, delete "layer" and insert -- layers --, therefor.

In column 9, line 29, in Claim 25, after "wherein" insert -- the --.

In column 9, line 40, in Claim 28, after "system" insert -- , --.

In column 10, line 14, in Claim 30, after "system" delete "of claim 19,".

In column 10, line 23, in Claim 30, after "electrodes" insert -- ; --.

In column 10, line 26, in Claim 31, after "wherein the" insert -- first electrodes extend in a --.

In column 10, line 33, in Claim 33, delete "elongate" and insert -- layers --, therefor.

Signed and Sealed this

Twenty-sixth Day of September, 2006

JON W. DUDAS
*Director of the United States Patent and Trademark Office*